US012793939B2

(12) United States Patent
Marakhtanov et al.

(10) Patent No.: US 12,793,939 B2
(45) Date of Patent: Nov. 10, 2026

(54) SYSTEMS AND METHODS FOR DETERMINING A PHASE DIFFERENCE BETWEEN RF SIGNALS PROVIDED TO ELECTRODES

(71) Applicant: Lam Research Corporation, Fremont, CA (US)

(72) Inventors: Alexei M. Marakhtanov, Albany, CA (US); Takumi Yanagawa, Fremont, CA (US); Fabio Righetti, Redwood City, CA (US); Zehua Jin, San Jose, CA (US); Kenneth Lucchesi, Newark, CA (US); Felix Leib Kozakevich, Sunnyvale, CA (US); John Patrick Holland, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 382 days.

(21) Appl. No.: 18/701,207

(22) PCT Filed: Sep. 16, 2022

(86) PCT No.: PCT/US2022/043898
§ 371 (c)(1),
(2) Date: Apr. 12, 2024

(87) PCT Pub. No.: WO2023/069211
PCT Pub. Date: Apr. 27, 2023

(65) Prior Publication Data

US 2024/0404789 A1 Dec. 5, 2024

Related U.S. Application Data

(60) Provisional application No. 63/257,077, filed on Oct. 18, 2021.

(51) Int. Cl.
*H01J 37/32* (2006.01)

(52) U.S. Cl.
CPC .. *H01J 37/32165* (2013.01); *H01J 37/32174* (2013.01); *H01J 37/32935* (2013.01)

(58) Field of Classification Search
CPC ........... H01J 37/32165; H01J 37/32174; H01J 37/32935; H01J 37/3299; H01J 37/321
See application file for complete search history.

(56) References Cited

U.S. PATENT DOCUMENTS 9,117,767 B2 8/2015 Marakhtanov et al.
2013/0320852 A1 12/2013 Kitano et al.
(Continued)

FOREIGN PATENT DOCUMENTS

KR 1020170052062 A 5/2017

OTHER PUBLICATIONS

ISR & WO PCT/US2022/043898, dated Jan. 10, 2023, 8 pages.

*Primary Examiner* — Jonathan P Ouellette
(74) *Attorney, Agent, or Firm* — Polygon IP, LLP

(57) ABSTRACT

A method for increasing a rate of processing a substrate to achieve an etch profile of the substrate is described. The method includes receiving a parameter signal from a first sensor when a first radio frequency (RF) signal is provided to a substrate support and a second RF signal is provided to an upper electrode. The method further includes determining, based on the parameter signal, a first time at which a value of a parameter is maximum. The method also includes receiving a variable signal from a second sensor. The method includes determining, based on the variable signal, a second time at which a first amount of flux of secondary electrons from the upper electrode to the substrate support is maximum. The method includes determining a phase dif-
(Continued)

(Phase Determination Method)

ference to be a difference between the first time and the second time and achieving the phase difference.

20 Claims, 7 Drawing Sheets

(56) References Cited

U.S. PATENT DOCUMENTS

| | | | |
|---|---|---|---|
| 2016/0247666 | A1 | 8/2016 | Urakawa et al. |
| 2019/0237300 | A1 | 8/2019 | Ikeda et al. |
| 2020/0161093 | A1 | 5/2020 | Li et al. |

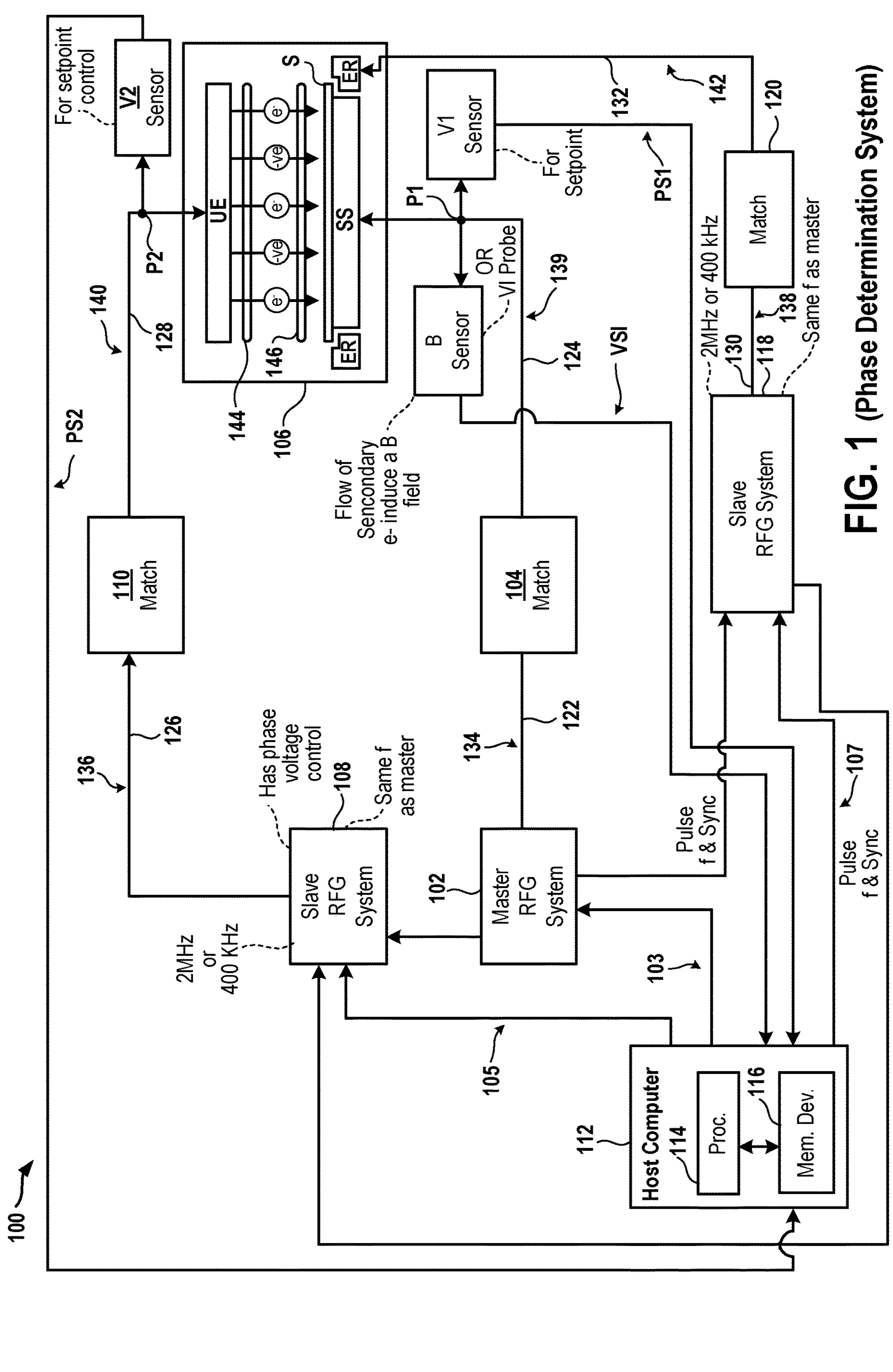
FIG. 1 (Phase Determination System)

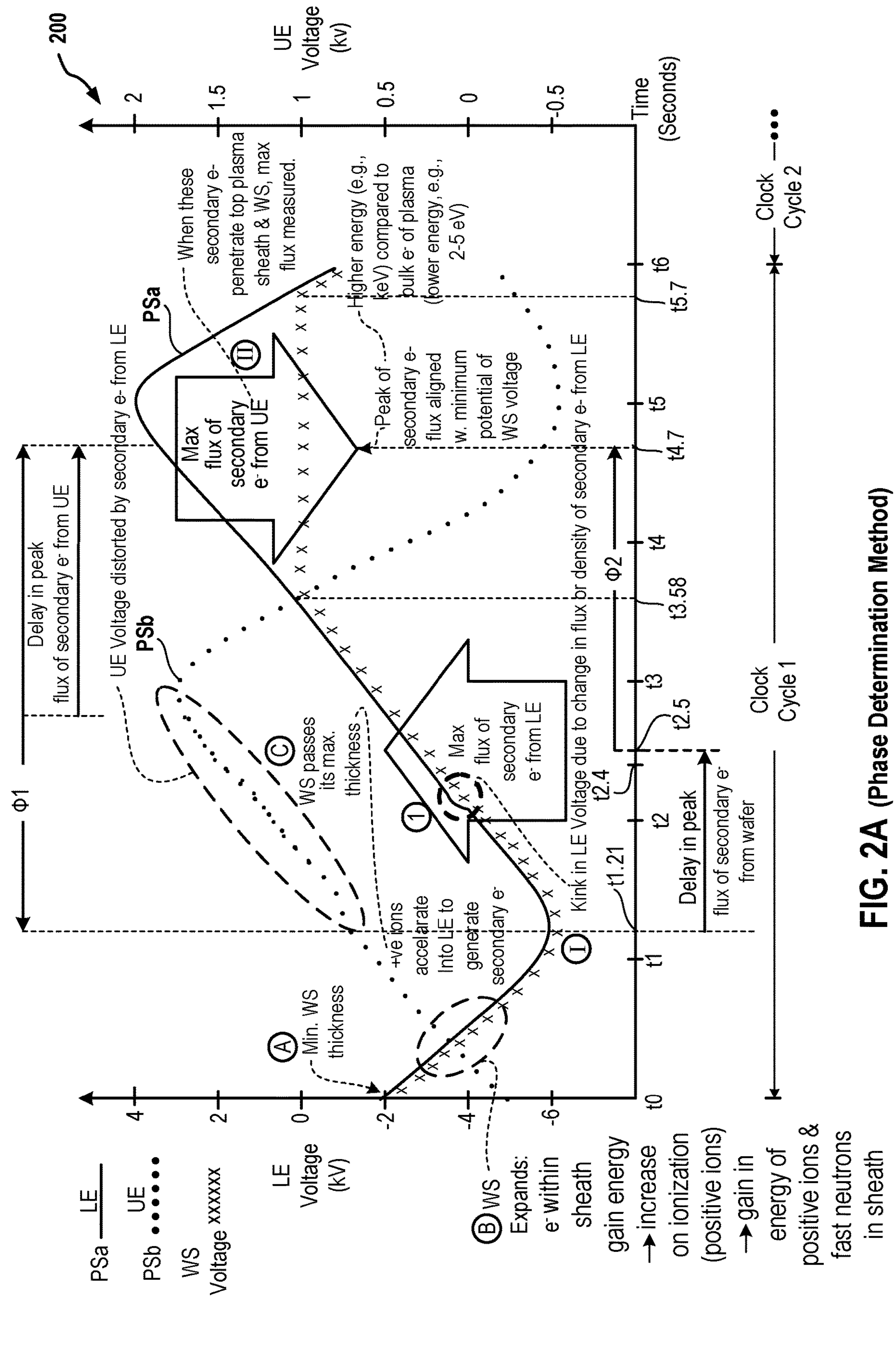
FIG. 2A (Phase Determination Method)

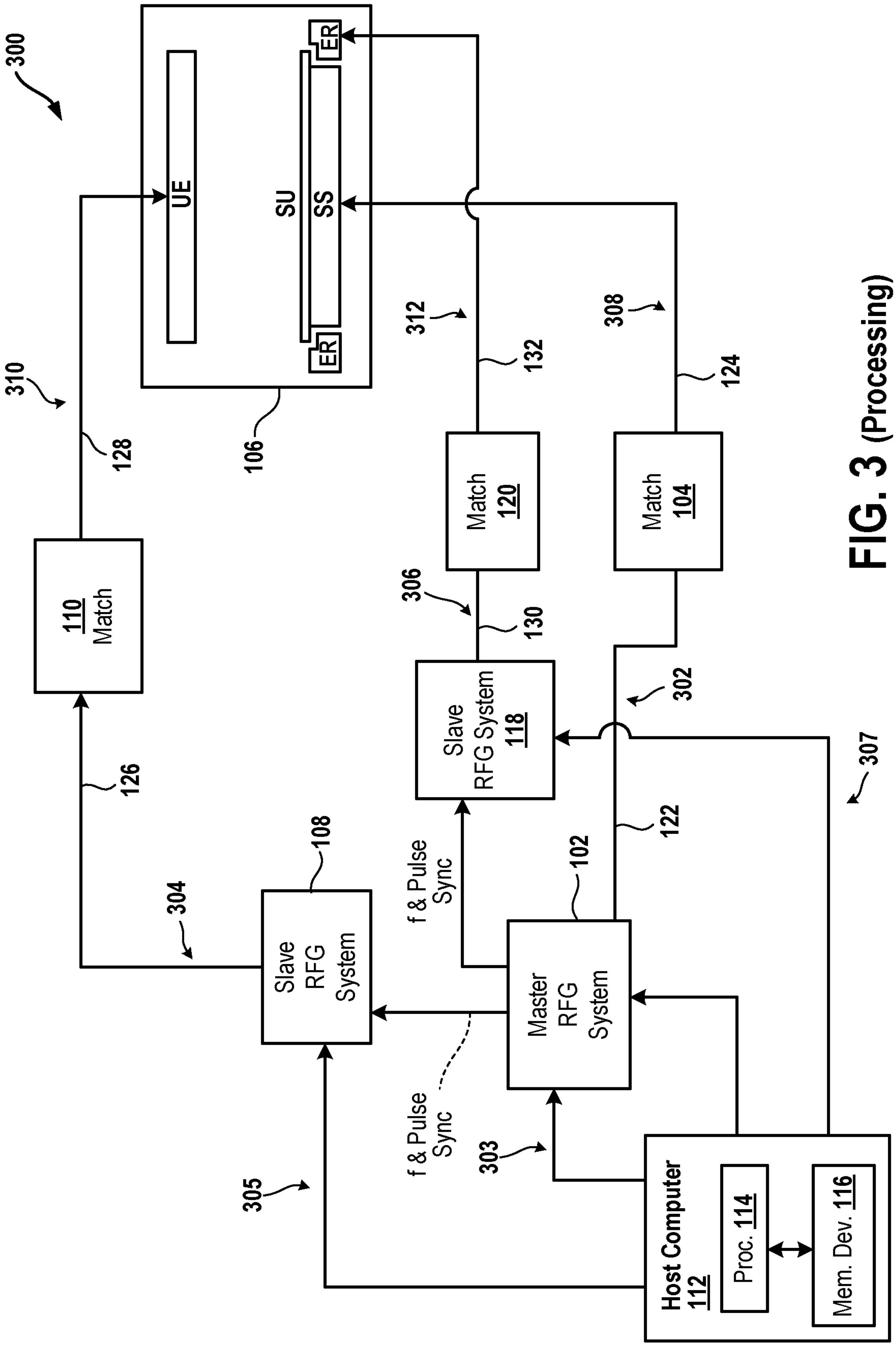
FIG. 3 (Processing)

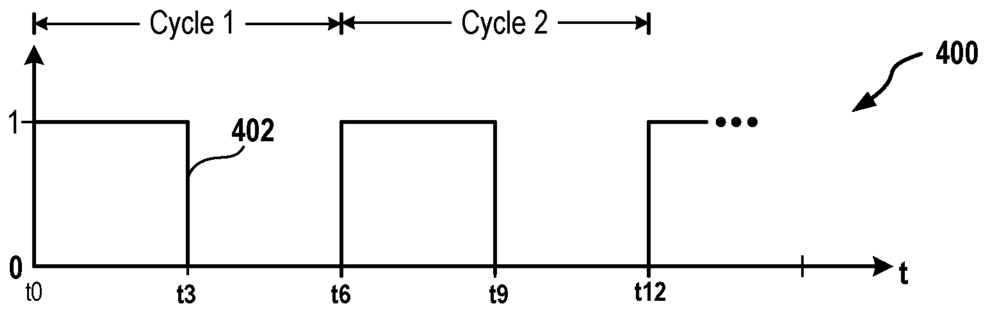
FIG. 4 (Pulsing Clock)
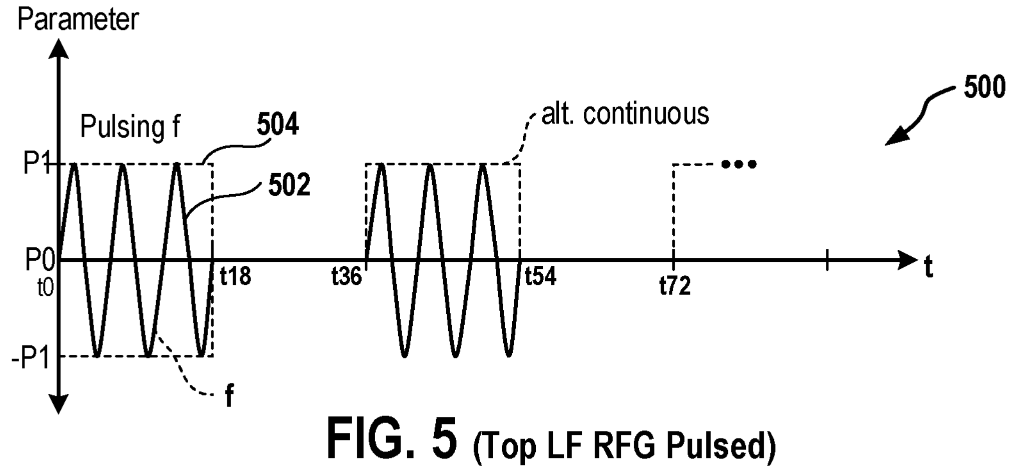
FIG. 5 (Top LF RFG Pulsed)
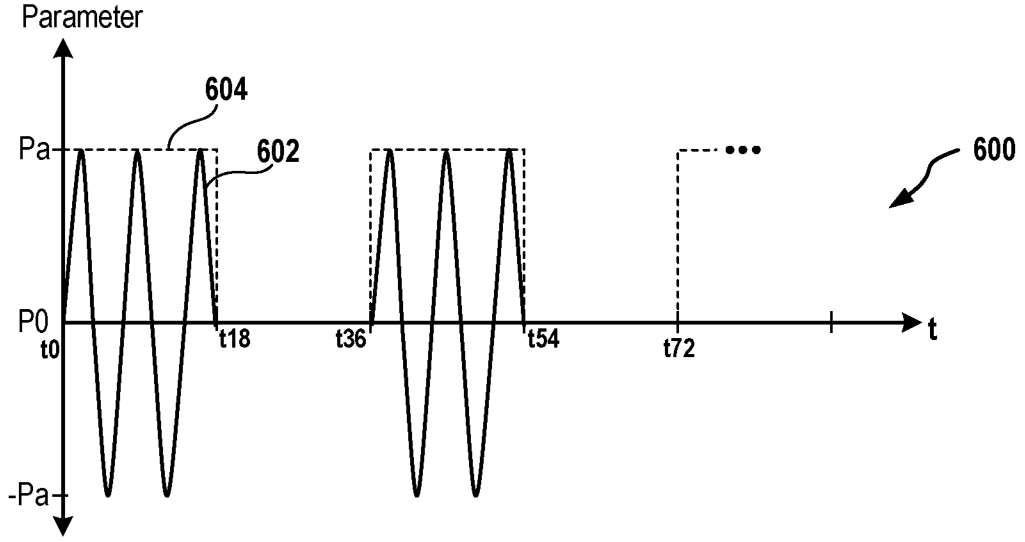
FIG. 6 (Bias LF RFG Pulsed)

(W/O Phase Control)

SYSTEMS AND METHODS FOR DETERMINING A PHASE DIFFERENCE BETWEEN RF SIGNALS PROVIDED TO ELECTRODES

CLAIM OF PRIORITY

This application is a national stage filing of and claims priority, under 35 U.S.C. § 371, to PCT/US2022/043898, filed on Sep. 16, 2022 and titled "SYSTEMS AND METHODS FOR DETERMINING A PHASE DIFFERENCE BETWEEN RF SIGNALS PROVIDED TO ELECTRODES", which claims the benefit of and priority, under 35 U.S.C. § 119 (e), to U.S. Provisional Patent Application No. 63/257,077, filed on Oct. 18, 2021, and titled "SYSTEMS AND METHODS FOR DETERMINING A PHASE DIFFERENCE BETWEEN RF SIGNALS PROVIDED TO ELECTRODES", all of which are incorporated by reference herein in their entirety.

FIELD

The embodiments described in the present disclosure relate to systems and methods for determining a phase difference between radio frequency (RF) signals provided to electrodes.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

One or more radiofrequency (RF) generators generate one or more RF signals and supply the RF signals to a plasma reactor. The plasma reactor has a semiconductor wafer that is etched when the one or more RF signals are supplied and an etchant gas is supplied to the plasma reactor. The semiconductor wafer includes numerous features. When the RF signals are supplied, side walls of the features are etched.

It is in this context that embodiments described in the present disclosure arise.

SUMMARY

Embodiments of the disclosure provide systems and methods for determining a phase difference between radio frequency (RF) signals provided to electrodes. It should be appreciated that the present embodiments can be implemented in numerous ways, e.g., a process, an apparatus, a system, a piece of hardware, or a method on a computer-readable medium. Several embodiments are described below.

In one embodiment, a method for increasing a rate of processing a substrate is described. The method includes receiving a parameter signal from a first sensor when a first radio frequency (RF) signal is provided to a substrate support and a second RF signal is provided to an upper electrode. The method further includes determining, based on the parameter signal, a first time at which a value of a parameter is maximum. The first time occurs during a cycle of a clock signal. The method also includes receiving a variable signal from a second sensor. The method includes determining, based on the variable signal, a second time at which a first amount of flux of secondary electrons from the upper electrode to the substrate support is maximum. The second time occurs during the cycle and occurs after the first time. The method includes determining a phase difference to be a difference between the first time and the second time and causing the phase difference between a phase of a third RF signal and a phase of a fourth RF signal. The third RF signal is provided to the upper electrode and the fourth RF signal is provided to the substrate support. The operation of causing the phase difference is performed to increase the rate of processing of the substrate.

In an embodiment, a method for increasing a rate of processing a substrate is described. The method includes determining a first time at which a first amount of flux of secondary electrons from a substrate support to an upper electrode is maximum. The first time occurs within a first clock cycle during which the substrate support receives a first RF signal and the upper electrode receives a second RF signal. The method further includes determining a second time at which a second amount of flux of secondary electrons from the upper electrode to the substrate support is maximum. The second time occurs within the first clock cycle. The method includes determining a phase difference to be a difference between the second time and the first time and causing the phase difference between a phase of a third RF signal and a phase of a fourth RF signal. The third RF signal is provided to the upper electrode and the fourth RF signal is provided to the substrate support. The operation of causing the phase difference is performed to increase the rate of processing of the substrate.

In one embodiment, a controller is described. The controller includes a processor that receives a parameter signal from a first sensor when a first RF signal is provided to a substrate support and a second RF signal is provided to an upper electrode. The processor determines, based on the parameter signal, a first time at which a value of a parameter is maximum. The first time occurs during a cycle of a clock signal. The processor further receives a variable signal from a second sensor. The processor determines, based on the variable signal, a second time at which a first amount of flux of secondary electrons from the upper electrode to the substrate support is maximum. The second time occurs during the cycle and occurs after the first time. The processor determines a phase difference to be a difference between the first time and the second time. The processor causes the phase difference between a phase of a third RF signal and a phase of a fourth RF signal. The third RF signal is provided to the upper electrode and the fourth RF signal is provided to the substrate support, and the phase difference is caused to increase the rate of processing of the substrate. The controller includes a memory device coupled to the processor.

Some advantages of the herein described systems and methods for determining a phase difference between RF signals provided to electrodes include increasing a rate of processing of a substrate and improving an etch profile of the substrate. The etch profile provides a cross-sectional side of etch features, such as contact holes or trenches, of the substrate. By achieving the phase difference, acceleration of secondary electrons that flow from an upper electrode to a lower electrode is increased. The secondary electrons can penetrate a top plasma sheath, plasma, and a bottom plasma sheath to be incident on a surface of the substrate to be processed. The accelerated secondary electrons penetrate the etch features on the substrate, discharge positively charged side walls and bottom of the etch features, and, therefore, improve the etch profile and etch rate of the etch features.

The accelerated secondary electrons also reduce chances that the side walls of the etch features of the substrate are etched. When the etch features are penetrated more and the chances that the side walls are etched are reduced, depths of the etch features increase to improve the etch profile.

Some other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

FIG. 1 is a diagram of an embodiment of a system to illustrate a phase difference determination method during a lab routine.

FIG. 2A is an embodiment of a graph to illustrate a plot of a voltage that is associated with a lower electrode of a substrate support versus time and a voltage that is associated with an upper electrode versus the time.

FIG. 3 is a diagram of an embodiment of a system to illustrate application of a phase difference determined during the lab routine.

FIG. 4 is a diagram of an embodiment of a graph to illustrate a clock signal.

FIG. 5 is a diagram of an embodiment of a graph to illustrate a radio frequency (RF) signal that is pulsed.

FIG. 6 is a diagram of an embodiment of a graph to illustrate another RF signal that is pulsed.

DETAILED DESCRIPTION

Figure 2B:
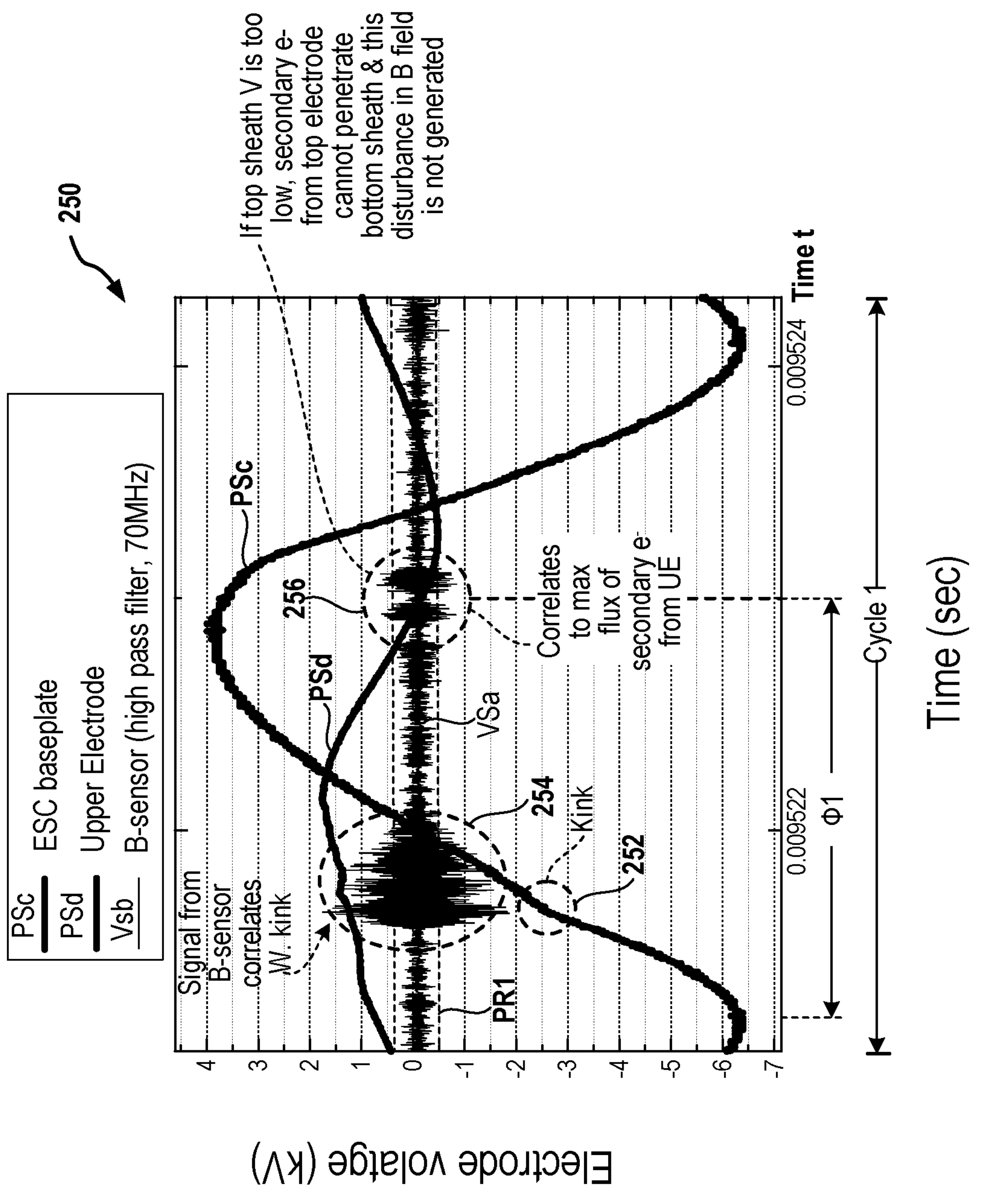
FIG. 2B is an embodiment of a graph to illustrate a plot of a voltage that is associated with the lower electrode versus the time and a voltage that is associated with the upper electrode versus the time.

The following embodiments describe systems and methods for determining a phase difference between radio frequency (RF) signals provided to electrodes. It will be apparent that the present embodiments may be practiced without some or all of these specific details. In other instances, well known process operations have not been described in detail in order not to unnecessarily obscure the present embodiments.

FIG. 1 is a diagram of an embodiment of a system 100 to illustrate a phase difference determination method. The system 100 includes a master RF generator system 102, a match 104, a plasma chamber 106, a slave RF generator system 108, another match 110, and a host computer 112. The host computer 112 includes a processor 114 and a memory device 116. The system 100 further includes another slave RF generator system 118 and a match 120.

A match, as used herein, is a network of circuit components, such as inductors, capacitors, and resistors. For example, the match includes one or more shunt circuits and one or more series circuits. Each shunt circuit has one or more of the circuit components and so does each series circuit. A branch circuit, which includes one or more shunt circuits or one or more series circuits or a combination thereof, of the match is coupled between an input of the match and an output of the match.

The system 100 further includes a magnetic field sensor. The magnetic field sensor is illustrated in FIG. 1 as a B sensor. The system 100 further includes a voltage (V1) sensor and another voltage (V2) sensor.

The plasma chamber 106 includes a substrate support SS, an edge ring ER, and an upper electrode UE. An example of the substrate support SS includes a chuck, which includes a lower electrode. The edge ring ER is an annular ring that surrounds a periphery of the substrate support SS. The upper electrode UE faces the substrate support SS.

Examples of the host computer 112 include a controller, a laptop computer, a desktop computer, a tablet, and a smart phone. Examples of the processor 114 include an application specific integrated circuit (ASIC), a programmable logic device (PLD), a central processing unit (CPU), a microprocessor, and a microcontroller. Examples of the memory device 116 include a read-only memory (ROM), a random access memory (RAM), and a combination thereof. To illustrate, the memory device 116 is a Flash memory or a redundant array of independent disks (RAID).

The processor 114 is coupled to the memory device 116. The processor 114 is also coupled to the master RF generator system 102, the slave RF generator system 108, and the slave RF generator system 118. For example, the processor 114 is coupled to a digital signal processor (DSP) of the master RF generator system 102 via a transfer cable, to a DSP of the slave RF generator system 108 via another transfer cable, and to a DSP of the slave RF generator system 118 via yet another transfer cable. Examples of a transfer cable include a cable that transfers a recipe signal in a serial manner, or a parallel manner, or using a universal serial bus (USB) protocol.

An example of the master RF generator system 102 is a master RF generator that has a low frequency, a medium frequency, or a high frequency of operation. An example of the slave RF generator system 108 is a slave RF generator that has the low frequency, the medium frequency, or the high frequency. Also, an example of the slave RF generator system 118 is a slave RF generator that has the low frequency, the medium frequency, or the high frequency. To illustrate, when the master RF generator system 102 has the low frequency, each of the slave RF generator system 108 and 118 has the low frequency. As another illustration, when the master RF generator system 102 has the medium frequency, each of the slave RF generator system 108 and 118 has the medium frequency. As yet another illustration, when the master RF generator system 102 has the high frequency, each of the slave RF generator system 108 and 118 has the high frequency.

Examples of the low frequency include 400 kilohertz (kHz) and 2 megahertz (MHz). Examples of the medium frequency include 13.56 MHz and 27 MHz. Examples of the high frequency include 60 MHZ.

The master RF generator system 102 is coupled to the match 104 via an RF cable 122, and the match 104 is coupled to the lower electrode of the substrate support SS via an RF transmission line 124. The slave RF generator system 108 is coupled to the match 110 via an RF cable 126, and the match 110 is coupled to the upper electrode UE via an RF transmission line 128. Also, the slave RF generator system 118 is coupled to the match 120 via an RF cable 130, and the match 120 is coupled to the edge ring ER via an RF transmission line 132. The master RF generator system 102 is coupled to the slave RF generator system 108 and to the slave RF generator system 118. For example, the DSP of the master RF generator system 102 is coupled to the DSP of the slave RF generator system 108 via a transfer cable and the DSP of the master RF generator system 102 is coupled to the DSP of the slave RF generator system 118 via another transfer cable.

The V1 sensor is coupled to a point P1 on the RF transmission line 124. Also, the B sensor is coupled to the point P1 on the RF transmission line 124 and the V2 sensor is coupled to a point P2 on the RF transmission line 128. A substrate S, such as a semiconductor wafer or a dummy substrate, is placed within the plasma chamber 106 on a top surface of the substrate support SS.

The processor 114 provides a recipe signal 103 to the master RF generator system 102, a recipe signal 105 to the slave RF generator system 108, and yet another recipe signal 107 to the slave RF generator system 118. Upon receiving the recipe signal 103 from the processor 114, the master RF generator system 102 provides a frequency indicated within the recipe signal 103 to each of the slave RF generator system 108 and the slave RF generator system 118.

The recipe signal 103 provided to the master RF generator system 102 includes a power level, a phase, a pulsing frequency, and the frequency of an RF signal 134 to be generated by the master RF generator system 102. As an example, a pulsing frequency of an RF signal is a frequency with which an envelope of the RF signal is pulsed from a first power level to a second power level. In the example, the envelope is a peak-to-peak amplitude or a zero-to-peak amplitude of the RF signal. To illustrate, the pulsing frequency of the RF signal is lower than a frequency of the RF signal. Similarly, the recipe signal 105 provided to the slave RF generator system 108 includes a power level of an RF signal 136 to be generated by the slave RF generator system 108 and the recipe signal 107 provided to the slave RF generator system 118 includes a power level of an RF signal 138 to be generated by the slave RF generator system 118.

Upon receiving the recipe signal 103 from the master RF generator system 102, the slave RF generator system 108 identifies the frequency indicated within the recipe signal 103, and determines a frequency of the RF signal 136 to be generated by the slave RF generator system 108 based on the frequency indicated within the recipe signal 103. For example, the DSP of the slave RF generator system 108 determines the frequency of the RF signal 136 to be equal to the frequency of the RF signal 134. As another example, the DSP of the slave RF generator system 108 determines the frequency of the RF signal 136 to be within a predetermined range from the frequency of the RF signal 134.

Also, upon receiving the recipe signal 103 from the master RF generator system 102, the slave RF generator system 108 identifies the pulsing frequency indicated within the recipe signal 103, and determines a pulsing frequency of the RF signal 136 to be generated by the slave RF generator system 108. For example, the DSP of the slave RF generator system 108 determines the pulsing frequency of the RF signal 136 to be synchronized to the pulsing frequency of the RF signal 134. To illustrate, an envelope of the RF signal 136 transitions from a first power level to a second power level at the same time at which an envelope of the RF signal 134 transitions from a third power level to fourth power level. As another example, the DSP of the slave RF generator system 108 determines the pulsing frequency of the RF signal 136 to be within a predetermined range from the pulsing frequency of the RF signal 134. To illustrate, an envelope of the RF signal 136 transitions from a first power level to a second power level within a pre-determined time period from a time at which an envelope of the RF signal 134 transitions from a third power level to fourth power level.

Upon receiving the recipe signal 103 from the master RF generator system 102, the slave RF generator system 118 identifies the frequency and the phase indicated within the recipe signal 103, and determines a frequency and a phase of the RF signal 138 to be generated by the slave RF generator system 118. For example, the DSP of the slave RF generator system 118 determines the frequency of the RF signal 138 to be equal to the frequency of the RF signal 134. As another example, the DSP of the slave RF generator system 118 determines the frequency of the RF signal 138 to be within a predetermined range from the frequency of the RF signal 134. As yet another example, the DSP of the slave RF generator system 118 determines the phase of the RF signal 138 to be the same as the phase of the RF signal 134. As still another example, the DSP of the slave RF generator system 118 determines the phase of the RF signal 138 to be within a predetermined range from the phase of the RF signal 134.

Also, upon receiving the recipe signal 103 from the master RF generator system 102, the slave RF generator system 118 identifies the pulsing frequency indicated within the recipe signal 103, and determines a pulsing frequency of the RF signal 138 to be generated by the slave RF generator system 118. For example, the DSP of the slave RF generator system 118 determines the pulsing frequency of the RF signal 138 to be synchronized to the pulsing frequency of the RF signal 134. To illustrate, an envelope of the RF signal 138 transitions from a first power level to a second power level at the same time at which an envelope of the RF signal 134 transitions from a third power level to fourth power level. As another example, the DSP of the slave RF generator system 118 determines the pulsing frequency of the RF signal 138 to be within a predetermined range from the pulsing frequency of the RF signal 134. To illustrate, an envelope of the RF signal 138 transitions from a first power level to a second power level within a pre-determined time period from a time at which an envelope of the RF signal 134 transitions from a third power level to fourth power level.

In addition, the processor 114 sends a trigger signal to each of the master RF generator system 102, the slave RF generator system 108, and the slave RF generator system 118. Upon receiving the trigger signal, the master RF generator system 102 generates the RF signal 134 having the frequency, the phase, the pulsing frequency, and the power level indicated within the recipe signal 103 received from the processor 114, and sends the RF signal 134 via the RF cable 122 to an input of the match 104. Similarly, upon receiving the trigger signal, the slave RF generator system 108 generates the RF signal 136 based on the frequency and the pulsing frequency identified within the recipe signal 103 received from the master RF generator system 102 and having the power level indicated within the recipe signal 105 received from the processor 114, and sends the RF signal 136 via the RF cable 126 to an input of the match 110. Also, upon receiving the trigger signal, the slave RF generator system 118 generates the RF signal 138 based on the frequency and the phase identified from the recipe signal 103 received from the master RF generator system 102 and having the power level indicated within the recipe signal 107 received from the processor 114, and sends the RF signal 138 via the RF cable 130 to an input of the match 120.

Upon receiving the RF signal 134 at the input of the match 104, the match 104 matches an impedance of a load coupled to an output of the match 104 with that of a source coupled to the input of the match 104. An example of the source coupled to the input of the match 104 includes the master RF generator system 102 and the RF cable 122 and an example of the load coupled to the output of the match 104 includes the plasma chamber 106 and the RF transmission line 124. The impedances are matched to modify an impedance of the RF signal 134 to provide a modified RF signal 139 at the output of the match 104. The modified RF signal 139 is provided to the lower electrode of the substrate support SS via the RF transmission line 124.

Similarly, upon receiving the RF signal 136 at the input of the match 110, the match 110 matches an impedance of a load coupled to an output of the match 110 with that of a source coupled to the input of the match 110. An example of the source coupled to the input of the match 110 includes the slave RF generator system 108 and the RF cable 126, and an example of the load coupled to the output of the match 110 includes the plasma chamber 106 and the RF transmission line 128. The impedances are matched to modify an impedance of the RF signal 136 to provide a modified RF signal 140 at the output of the match 110. The modified RF signal 140 is provided to the upper electrode UE via the RF transmission line 128.

Also, upon receiving the RF signal 138 at the input of the match 120, the match 120 matches an impedance of a load coupled to an output of the match 120 with that of a source coupled to the input of the match 120. An example of the source coupled to the input of the match 120 includes the slave RF generator system 118 and the RF cable 130, and an example of the load coupled to the output of the match 120 includes the plasma chamber 106 and the RF transmission line 132. The impedances are matched to modify an impedance of the RF signal 138 to provide a modified RF signal 142 at the output of the match 120. The modified RF signal 142 is provided to the edge ring ER via the RF transmission line 132.

When one or more process gases are supplied to a gap between the substrate support SS and the upper electrode UE within the plasma chamber 106 in addition to the modified RF signals 139, 140, and 142, plasma is stricken or maintained within the plasma chamber 106. Examples of the one or more process gases include an oxygen containing gas, a nitrogen containing gas, a fluorine containing gas and a combination thereof. The plasma generated within the plasma chamber 106 is used to process the substrate S. For example, the plasma is used to deposit materials on a top surface of the substrate S or etch the substrate S or clean the substrate S. The plasma is surrounded at its top side by a top plasma sheath 144 and at its bottom side by a bottom plasma sheath 146. The plasma includes electrons (e) and negative ions (−ve), which are incident on the top surface of the substrate S to process the substrate S.

When the substrate S is processed, the V1 sensor measures a voltage at the point P1 on the RF transmission line 124 to output a parameter signal PS1, the V2 sensor measures a voltage at the point P2 on the RF transmission line 128 to output a parameter signal PS2. An example of a parameter, as used herein, is a voltage. Also, the B sensor measures a magnetic field or a magnetic flux at the point P1 on the RF transmission lines 124 to output a variable signal VS1.

The parameter signal PS1 is provided from the V1 sensor to the processor 114. The processor 114 controls a set point of the RF signal 134 based on the parameter signal PS1. For example, upon determining a voltage indicated by the parameter signal PS1 is not within a predetermined range from a predetermined voltage setpoint, the processor 114 modifies the power level provided within the recipe signal 103 to the master RF generator system 102. It should be noted that when the setpoint of the RF signal 134 is controlled, a setpoint of the RF signal 138 is also controlled. For example, the modified power level that is sent from the processor to the master RF generator system 102 is further sent from the master RF generator system 102 to the slave RF generator system 118. Upon receiving the modified power level, the slave RF generator system 118 modifies a power level of the RF signal 138 to achieve the modified power level.

Similarly, the parameter signal PS2 is provided from the V2 sensor to the processor 114. The processor 114 controls a set point of the RF signal 136 based on the parameter signal PS2. For example, upon determining a voltage indicated by the parameter signal PS2 is not within a predetermined range from a predetermined voltage setpoint, the processor 114 modifies the power level provided within the recipe signal 105 to the slave RF generator system 108.

In one embodiment, the B sensor measures the magnetic field or magnetic flux at a different point on the RF transmission line 124 than the point P1. The different point is located between the output of the match 104 and the plasma chamber 106.

In an embodiment, instead of the point P2, the V2 sensor is coupled to any other point between the output of the match 110 and the plasma chamber 106.

In an embodiment, instead of the point P1, the V1 sensor is coupled to any other point between the output of the match 104 and the plasma chamber 106.

In an embodiment, instead of the B sensor, a complex voltage and current (VI) probe that measures a complex voltage and current at the point P1 is used.

In one embodiment, the master RF generator system 102 includes multiple RF generators, such as a first master RF generator and a second master RF generator. Similarly, the slave RF generator system 108 includes multiple RF generators, such as a first slave RF generator and a second slave master RF generator. Also, the slave RF generator system 118 includes multiple RF generators, such as a third slave RF generator and a fourth slave master RF generator. The first master RF generator has the low, medium, or high frequency of operation and the second master RF generator has the low, medium, or high frequency of operation. Also, the first slave RF generator has the low, medium, or high frequency of operation and the second slave RF generator has the low, medium, or high frequency of operation. Moreover, the third slave RF generator has the low, medium, or high frequency of operation and the fourth slave RF generator has the low, medium, or high frequency of operation. To illustrate, each of the first slave RF generator and the third slave RF generator has the same frequency of operation as that of the first master RF generator, and each of the second slave RF generator and the fourth slave RF generator has the same frequency of operation as that of the second master RF generator. It should be noted that the first master RF generator is coupled to the first slave RF generator and the third slave RF generator, and the second master RF generator is coupled to the second slave RF generator and the fourth slave RF generator.

Further, in the embodiment, the first and second master RF generators are coupled via a first match to the substrate support SS, the first and second slave RF generators are coupled via a second match to the edge ring ER, and the third and fourth slave RF generators are coupled via a third match to the upper electrode UE. The processor 114 is coupled to each of the first master RF generator, the second master RF generator, the first slave RF generator, the second slave RF generator, the third slave RF generator, and the fourth slave RF generator.

Continuing with the embodiment, the processor 114 controls the first master RF generator, the first slave RF generator, and the third slave RF generator in the same manner as that in which the master RF generator system 102, the slave RF generator system 118, and the slave RF generator system 108 are controlled. Also, the first master RF generator controls each of the first and third slave RF generator in the same manner in which the master RF generator system 102 controls each of the slave RF generator system 118 and the slave RF generator system 108. Also, in the embodiment, the processor 114 controls the second master RF generator, the second slave RF generator, and the fourth slave RF generator in the same manner as that in which the master RF generator system 102, the slave RF generator system 118, and the slave RF generator system 108 are controlled. Also, the second master RF generator controls each of the second and fourth slave RF generator in the same manner in which the master RF generator system 102 controls each of the slave RF generator system 118 and the slave RF generator system 108.

In one embodiment, the terms cause and achieve are used herein interchangeably. Also, in the embodiment, the terms causing and achieving are used herein interchangeably.

FIG. 2A is an embodiment of a graph 200 to illustrate a plot of a voltage that is associated with the lower electrode of the substrate support SS versus time t and a voltage that is associated with the upper electrode UE versus the time t. The voltage that is associated with lower electrode is plotted as a parameter signal PSa on a first y-axis and is measured in kilovolts (kV) by the V1 sensor (FIG. 1) and the voltage that is associated with the upper electrode is plotted as a parameter signal PSb on a second y-axis and is measured in kV by the V2 sensor (FIG. 1). The parameter signal PSa is an example of the parameter signal PS1 (FIG. 1) and the parameter signal PSb is an example of the parameter signal PS2 (FIG. 1). The time t is plotted on an x-axis, measured in seconds, and includes progressively occurring times t0, t1, t2, t3, t4, t5, and t6. The parameter signal PSa is illustrated as a solid curve and the parameter signal PSb is illustrated as a dotted curve. Moreover, the graph 200 includes a plot of a voltage of a plasma sheath, such as the bottom plasma sheath 146 or the top plasma sheath 144 or a combination thereof (FIG. 1). The voltage of the plasma sheath is illustrated as a curve having "x"s.

At a location A on the plot of the parameter signal PSa, the bottom plasma sheath (WS) 146 has a minimum amount of thickness when the parameter signal PSa has a minimum value, where WS stands for wafer sheath or the plasma sheath. As an example, the parameter signal PSa has the minimum value when the RF signal 134 that is supplied by the master RFG system 102 has a minimum value. The parameter signal PSa has the minimum value at the time t0 during a cycle 1 of a clock signal. The cycle 1 extends from the time t0 to the time t6, and a cycle 2 of the clock signal repeats after the time t6. The cycle 2 extends from the time t6 to a time t12 of the time t. The clock signal is generated by a clock source, such as a digital clock signal generator or an electronic oscillator. For example, the clock signal is generated by a clock source of the host computer 112 (FIG. 1). As another example, the clock signal is generated by the processor 114 (FIG. 1). The location A corresponds to the time t0.

As the voltage of the parameter signal PSa increases from the minimum value to an intermediate value at a location B on the plot of the parameter signal PSa, the bottom plasma sheath 146 expands. As an example, the parameter signal PSa has the intermediate value when the RF signal 134 that is supplied by the master RFG system 102 has an intermediate value. The parameter signal PSa has the intermediate value during a time period between the time t0 and a time t1, and the time period and the time t1 occur during the cycle 1 of the clock signal. The time t1 occurs after the time t0. During the time period between the time t0 and t1, with the expansion of the bottom plasma sheath 146, electrons within the bottom plasma sheath 146 gain energy and the increase in the energy results in an increase in ionization, and with the increase in ionization, positive ions are generated. With the increase in ionization, there is an increase in energy of the positive ions of the bottom plasma sheath 146 and increase in energy of fast neutral atoms in the bottom plasma sheath 146.

Moreover, the voltage of the parameter signal PSa increases further from the intermediate value to a maximum value at a location I on the plot of the parameter signal PSa. As an example, the parameter signal PSa has the maximum value when the RF signal 134 that is supplied by the master RFG system 102 has a maximum value. The maximum value of the master RF signal 134 is greater than the intermediate value of the master RF signal 134, and the intermediate value is greater than the minimum value of the master RF signal 134. Also, the maximum value of the parameter signal PSa is greater than the intermediate value of the parameter signal PSa, and the intermediate value is greater than the minimum value of the parameter signal PSa. The parameter signal PSa has the maximum value at a time t1.21, and the time t1.21 occurs during the cycle 1 of the clock signal. The time t1.21 occurs after the time t1 and before the time t2. At the time t1.21, the positive ions of the bottom plasma sheath 146 of the bottom plasma sheath 146 that have gained energy accelerate from the bottom plasma sheath 146 towards the lower electrode to generate secondary electrons.

It should be noted that the secondary electrons are different from bulk electrons of the plasma located between the top plasma sheath 144 and the bottom plasma sheath 146. The secondary electrons have higher energy, measured in kilo electron volts (keV), compared to the bulk electrons. For example, the energy of the secondary electrons ranges in keV and the energy of the bulk electrons ranges between two to five electron volts.

As the secondary electrons accelerate from the bottom plasma sheath 146 towards the lower electrode, there is a kink in the plot of the parameter signal PSa at a location 1. For example, there is a small amount of distortion at the location 1 of the plot of the parameter signal PSa. The location 1 occurs during a time period between the time t2 and a time t2.4. The time t2.4 occurs between the time t2 and the time t3.

As the voltage of the parameter signal PSa decreases from the maximum value, there is an increase in flux of the secondary electrons from the lower electrode to the upper electrode UE. At a location C on the plot of the parameter signal PSb, the increase in flux of the secondary electrons creates a distortion in the parameter signal PSb. The distortion in the parameter signal PSb illustrates a distortion in voltage at the upper electrode UE. The location C extends across a time period between the time t1.21 and the time t3.

A voltage of the parameter signal PSb decreases during a time period between the time t0 and the time t1.21 and increases during a time period from the time t1.21 to the time t3. Also, an amplitude of the RF signal 136 (FIG. 1) that is generated by the slave RFG system 108 (FIG. 1) decreases during the time period between the time t0 and the time t1.21 and increases during the time period from the time t1.21 to the time t3.

The voltage of the parameter signal PSa increases during a time period from the time t3 to the time t5. Also, the amplitude of the RF signal 134 increases during the time period between the time t3 to the time t5. As the amplitude of the RF signal 134 increases during the time period between the time t3 and t5, a flux of secondary electrons that flow from the upper electrode UE to the lower electrode increases. The secondary electrons penetrate the top plasma sheath 144 (FIG. 1), flow from the top plasma sheath 144 to the bottom plasma sheath 146 via the plasma, and penetrate the bottom plasma sheath 146 to process the substrate S (FIG. 1). At the time t5, the voltage of the parameter signal PS1 is maximum. Also, at the time t5, the amplitude of the RF signal 134 is maximum. For example, the amplitude of the RF signal 134 and the voltage of the parameter signal PS1 is maximum for a second time at the time t5 during the cycle 1. In the example, the amplitude of the RF signal 134 and the voltage of the parameter signal PS1 is maximum for a first time at the time t1.21 during the cycle 1. Further, a location II on the parameter signal PSa occurs at a time t4.7, which occurs between the times t4 and t5. It should be noted that the time t4.7 occurs during the cycle 1 of the clock signal. At the location II, the flux of the secondary electrons that flow from the upper electrode UE to the lower electrode is maximum.

As illustrated by the plot of the voltage of the plasma sheath, the voltage of the plasma sheath traces or follows the parameter signal PSa from the time t0 to a time t3.58, which occurs between the times t3 and t4. The voltage of the plasma sheath achieves a flat horizontal level from the time t3.58 to a time t5.7, which occurs between the times t5 and t6, and then the voltage of the plasma sheath continues to trace the variable signal parameter signal PSa. At the flat horizontal level, the voltage of the plasma sheath is minimum. As such, a peak, such as a maximum, voltage of the parameter signal PSa occurs during the time period in which the voltage of the plasma sheath achieves the flat horizontal level.

The graph 200 is used to illustrate the phase difference determination method, which includes a determination of a phase difference between the parameter signals PSa and PSb. The phase difference determination method occurs during a lab routine, which occurs before processing of another substrate. In the phase difference determination method, the processor 114 receives the parameter signal PSa from the V1 sensor and the variable signal VS1 (FIG. 1) from the B sensor. The processor 114 determines that a voltage of the parameter signal PSa has a first occurrence of a maximum value at the time t1.21 during the cycle 1 of the clock signal. For example, the processor 114 determines that the voltage of the parameter signal PSa achieves a maximum value for a first time after the time t0 at which the voltage of the parameter signal PSa is minimum. In the example, the voltage of the parameter signal PSa achieves another maximum value, at the time t5, for a second time after the time t0. To illustrate, the processor 114 determines that a value of the parameter signal PSa received at the time t1.21 is maximum among all values of the parameter signal PSa received from the voltage sensor VS1. In the illustration, the values of the parameter signal PSa are received during a time period between the times t0 and t3. The processor 114 stores the time t1.21 in the memory device 116.

Moreover, the processor 114 receives the variable signal VS1 from the B sensor. The processor 114 determines from the variable signal VS1 whether a flux of the secondary electrons has a second occurrence of a maximum value during the cycle 1 of the clock signal, and further identifies a time within a time period during which the second occurrence occurs. When the flux of secondary electrons is maximum for a second time during the cycle 1, the second occurrence of maximum flux of the secondary electrons occurs during the cycle 1. As an example, the processor 114 receives the variable signal VS1 between the times t3 and t6 from the B sensor, and determines that among values of the variable signal VS1, a value of the variable signal VS1 is maximum between the times t3.58 and t5.7 to further determine that the second occurrence of maximum flux occurs between the times t3.58 and t5.7.

As another example, the processor 114 determines from the variable signal VS1 whether an amplitude of the variable signal VS1 is substantially the same for a predetermined period of time. To illustrate, the processor 114 determines from the variable signal VS1 whether an amplitude of the variable signal VS1 is within a predetermined range for the predetermined period of time for which the variable signal VS1 is received from the B sensor. In the illustration, an example of the predetermined period of time is half of a time period of the cycle 1 of the clock signal. To further illustrate, the processor 114 determines from the variable signal VS1 whether the amplitude of the variable signal varies within 5% for the time period between the times t3.58 and t5.7 during which the variable signal VS1 is received from the B sensor. In the further illustration, the processor 114 determines that the amplitude varies within 5% from an amplitude of the variable signal at the time t3.58. In the further illustration, upon determining that the amplitude varies within 5%, the processor 114 determines that the flux of the secondary electrons has the second occurrence of the maximum value during the cycle 1. In the further illustration, the processor 114 identifies the time t4.7 that occurs within the time period between the times t3.58 and t5.7.

As yet another example, the processor 114 determines from the variable signal VS1 that an amplitude of the variable signal VS1 is substantially the same for the predetermined period of time and is maximum to determine that the second occurrence of maximum flux of secondary electrons has occurred at the time t4.7. It should be noted that in any of the preceding three examples, the processor 114 identifies any time within the time period between the times 3.58 and t5.7. For example, instead of the time t4.7, the processor 114 identifies a time t4.6 or the time t5, both of which occur within the time period between the times 3.58 and t5.7.

It should be noted that a first occurrence of maximum flux of secondary electrons occurs during the cycle 1, and the second occurrence of maximum flux occurs after the first occurrence of maximum flux. For example, the processor 114 receives the variable signal VS1 between the times t0 and t3, and determines that among values of the variable signal VS1, a value of the variable signal VS1 is maximum at the time t2.5, and further determines that the first occurrence of maximum flux occurs at a time t2.5. There is a delay between the times t1.21 and t2.5. The secondary electrons flow is maximum from the lower electrode to the upper electrode at the time t2.5. The time t2.5 occurs between the times t2 and t3.

The processor 114 determines a time difference between the a time, such as the time t4.7, of the second occurrence of the maximum value of the flux of secondary electrons and a time, such as the time t1.21, of the first occurrence of the maximum value of the voltage of the parameter signal PSa. The processor 114 stores the time difference as a phase difference ϕ1 within the memory device 116.

In one embodiment, during the lab routine, instead of identifying any time within the time period during which the second occurrence of maximum flux of secondary electrons occurs, the processor 114 identifies a time at which the second occurrence of maximum flux of the secondary electrons occurs during the cycle 1 as equal to a half of the time period between the times t3.58 and t5.7.

In an embodiment, during the lab routine, the processor 114 determines a phase difference ϕ2 as a difference between the time t4.7 and the time t2.5. During a time period between the times t0 and t4, the processor 114 receives the variable signal VS1 from the B sensor and determines that an amplitude of the variable signal VS1 is maximum for a first time at the time t2.5. For example, the processor 114 compares all values of the variable signal VS1 received during the time period between the times to and t4 to determine that the amplitude of the variable signal VS1 is maximum among all the values. In the example, the processor 114 further determines that the maximum amplitude is received from the B sensor at the time t2.5 to determine the time t2.5 at which a flux of secondary electrons from the lower electrode to the upper electrode UE is maximum. Similarly, during a time period between the times t4 and t6, the processor 114 receives the variable signal VS1 from the B sensor and determines that an amplitude of the variable signal VS1 is maximum for a second time at the time t4.7. For example, the processor 114 compares all values of the variable signal VS1 received during the time period between the times t4 and t6 to determine that the amplitude of the variable signal VS1 is maximum among all the values. In the example, the processor 114 further determines that the maximum amplitude is received from the B sensor at the time t4.7. A description of different ways of determining the time t4.7 is provided above. The processor 114 calculates the difference between the times t4.7 and t2.5 to determine the phase difference ϕ2.

FIG. 2B is an embodiment of a graph 250 to illustrate a plot of a voltage that is associated with the lower electrode of the substrate support SS versus the time t and a voltage that is associated with the upper electrode UE versus the time t. The voltage that is associated with lower electrode is plotted as a parameter signal PSc on a first y-axis and is measured in kV by the V1 sensor (FIG. 1) and the voltage that is associated with the upper electrode is plotted as a parameter signal PSd on a second y-axis and is measured in kV by the V2 sensor (FIG. 1). The parameter signal PSc is an example of the parameter signal PS1 (FIG. 1) and the parameter signal PSd is an example of the parameter signal PS2 (FIG. 1). The time t is plotted on an x-axis, measured in seconds. A time period illustrated in FIG. 2B extends over the cycle 1 of the clock signal. The parameter signal PSc is illustrated as a dark curve and the parameter signal PSd is illustrated as a light curve. Moreover, the graph 250 includes a plot of a variable signal VSa that is measured by the B sensor (FIG. 1). The variable signal VSa is illustrated as multiple distortions and is an example of the variable signal VS1 (FIG. 1).

A kink 252, such as a distortion or a disturbance, occurs within the plot of the parameter signal PSc. The kink 252 occurs during a time period in which an amount of distortion 254 in the variable signal VSa exceeds a predetermined range PRI for a first time during the cycle 1 of the clock signal. An example of the predetermined range PRI is a range that extends between −15% and 15% from a statistical value, such as an average or a median, generated from values of the variable signal VSa during the cycle 1. The processor 114 (FIG. 1) determines the statistical value from the values of the variable signal VSa received from the B sensor during the cycle 1. Also, the predetermined range PRI is stored in the memory device 116. The processor 114 determines that values of the variable signal VSa exceed the predetermined range PRI for the first time during the cycle 1. The amount of distortion 254 in the variable signal VSa is created for the first time during the cycle 1 by the secondary electrons flowing from the lower electrode to the upper electrode UE (FIG. 1). When the amount of distortion 254 in the variable signal VSa is created for the first time, there is a first occurrence or a first time interval of the distortion 254 in the variable signal VSa. A location of the kink 252 is an example of the location 1 in the graph 200 (FIG. 2A).

Moreover, an amount of distortion 256 in the variable signal VSa exceeds the predetermined range PRI for a second time during the cycle 1 of the clock signal. The processor 114 determines that values of the variable signal VSa exceed the predetermined range PRI for the second time during the cycle 1. The amount of distortion 256 in the variable signal VSa is created for the second time during the cycle 1 by the secondary electrons flowing from the upper electrode UE to the lower electrode. When the amount of distortion 256 in the variable signal VSa is created for the second time, there is a second occurrence or a second time interval of the distortion 256 in the variable signal VSa.

The processor 114 calculates a time difference between the occurrence of the distortion 256 and the occurrence of the distortion 254 to determine the phase difference ϕ2. For example, the processor 114 identifies a first time within the time interval during which the distortion 256 is measured by the B sensor and received by the processor 114 and further identifies a second time within the time interval during which the distortion 254 is measured by the B sensor and received by the processor 114. In the example, the processor 114 calculates a difference between the first time and the second time t0 determine the phase difference ϕ2.

It should be noted that if a voltage of the top plasma sheath 144 (FIG. 1) is low, the secondary electrons from the upper electrode UE cannot penetrate the bottom plasma sheath 146 and the distortion 256 is not created. As such, the distortion 256 is created when the voltage of the top plasma sheath 144 is high, and a phase of the top plasma sheath 144 is aligned with a low voltage phase of the bottom plasma sheath 146 for the secondary electrons generated from the upper electrode UE to penetrate the bottom plasma sheath 146.

FIG. 3 is a diagram of an embodiment of a system 300 to illustrate application of a phase difference ϕ, such as the phase difference ϕ1 or the phase difference ϕ2, determined during the lab routine. The phase difference ϕ that is determined during the lab routine is applied during processing of a substrate SU. An example of the substrate SU is a semiconductor wafer. To illustrate, the substrate S is not a dummy wafer.

The system 300 is the same, in structure, as the system 100 (FIG. 1) except the system 300 excludes the V1 sensor, the V2 sensor, and the B sensor. Moreover, the substrate SU is placed on the top surface of the substrate support SS instead of the substrate S.

The processor 114 provides a recipe signal 303 to the master RF generator system 102, a recipe signal 305 to the slave RF generator system 108, and yet another recipe signal 307 to the slave RF generator system 118. The recipe signal 303 is the same as the recipe signal 103 (FIG. 1) except that the recipe signal 303 includes a phase of an RF signal 302 to be generated by the master RFG system 102. The phase of the RF signal 302 included within the recipe signal 303 is different from a phase of the RF signal 304 to be generated by the slave RFG system 108 by the phase difference q. For example, the phase difference to be achieved between the phase of the RF signal 302 and the phase of the RF signal 304 is equal to ϕ. To illustrate, the phase of the RF signal 302 lags the phase of the RF signal 304 by the phase difference ϕ or the phase of the RF signal 304 leads the phase of the RF signal 302 by the phase difference ϕ. Upon receiving the recipe signal 303 from the processor 114, the master RF generator system 102 provides a frequency indicated within the recipe signal 303 to each of the slave RF generator system 108 and the slave RF generator system 118.

The recipe signal 303 provided to the master RF generator system 102 includes a power level, the phase, a pulsing frequency, and a frequency of the RF signal 302 to be generated by the master RF generator system 102. Similarly, the recipe signal 305 provided to the slave RF generator system 108 includes a power level and the phase of the RF signal 304 to be generated by the slave RF generator system 108 and the recipe signal 307 provided to the slave RF generator system 118 includes a power level of an RF signal 306 to be generated by the slave RF generator system 118.

Upon receiving the recipe signal 303 from the master RF generator system 102, the slave RF generator system 108 identifies the frequency indicated within the recipe signal 303, and determines a frequency of the RF signal 304 to be generated by the slave RF generator system 108 in the same manner in which the frequency of the RF signal 136 (FIG. 1) is determined from the frequency of the RF signal 134 (FIG. 1).

Also, upon receiving the recipe signal 303 from the master RF generator system 102, the slave RF generator system 108 identifies the pulsing frequency indicated within the recipe signal 303, and determines a pulsing frequency of the RF signal 304 to be generated by the slave RF generator system 108. The pulsing frequency of the RF signal 304 is determined in the same manner in which the pulsing frequency of the RF signal 136 is determined from the pulsing frequency of the RF signal 134.

Upon receiving the recipe signal 303 from the master RF generator system 102, the slave RF generator system 118 identifies the frequency and the phase indicated within the recipe signal, and determines a frequency and a phase of the RF signal 306 to be generated by the slave RF generator system 118. The frequency and the phase of the RF signal 306 are determined in the same manner in which the frequency and phase of the RF signal 138 (FIG. 1) are determined from the frequency and the phase of the RF signal 134.

Also, upon receiving the recipe signal 303 from the master RF generator system 102, the slave RF generator system 118 identifies the pulsing frequency indicated within the recipe signal 303, and determines a pulsing frequency of the RF signal 306 to be generated by the slave RF generator system 118. The pulsing frequency of the RF signal 306 is determined in the same manner in which the pulsing frequency of the RF signal 138 is determined from the pulsing frequency of the RF signal 134.

In addition, the processor 114 sends a trigger signal to each of the master RF generator system 102, the slave RF generator system 108, and the slave RF generator system 118. Upon receiving the trigger signal, the master RF generator system 102 generates the RF signal 302 having the frequency, the phase, the pulsing frequency, and the power level indicated within the recipe signal 303 received from the processor 114, and sends the RF signal 302 via the RF cable 122 to the input of the match 104. Similarly, upon receiving the trigger signal, the slave RF generator system 108 generates the RF signal 304 based on the frequency and the pulsing frequency identified from the recipe signal 303 received from the master RF generator system 102, and having the power level and the phase indicated within the recipe signal 305 received from the processor 114, and sends the RF signal 304 via the RF cable 126 to the input of the match 110.

It should be noted that after receiving the trigger signal, the master RF generator system 102 generates the RF signal 302 to achieve the phase difference ϕ with respect to the RF signal 304. For example, the master RF generator system 102 generates the RF signal 302 after an amount of time equal to the phase difference ϕ has elapsed after the RF signal 304 is generated or after the trigger signal is received. To illustrate, the DSP of the master RF generator system 102 sends a master control signal to a master RF power supply, such as an RF oscillator, after the amount of time equal to the phase difference ϕ. In the illustration, the master RF power supply is coupled to the DSP of the master RF generator system 102 and located within the master RF generator system 102. In the illustration, the DSP of the slave RF generator system 108 sends a slave control signal to a slave RF power supply, such as an RF oscillator, before the DSP of the master RF generator system 102 sends the master control signal to the master RF power supply. In the illustration, the slave RF power supply is coupled to the DSP of the slave RF generator system 108 and located within the slave RF generator system 108. Further, in the illustration, upon receiving the master control signal, the master RF power supply generates the RF signal 302 and upon receiving the slave control signal, the slave RF power supply generates the RF signal 304. Also, upon receiving the trigger signal, the slave RF generator system 118 generates the RF signal 306 based on the frequency, the pulsing frequency, and the phase identified from the recipe signal 303 received from the master RF generator system 102 and having the power level indicated within the recipe signal 307 received from the processor 114, and sends the RF signal 306 via the RF cable 130 to the input of the match 120.

Upon receiving the RF signal 302 at the input of the match 104, the match 104 matches an impedance of the load coupled to the output of the match 104 with an impedance of the source coupled to the input of the match 104. The impedances are matched to modify an impedance of the RF signal 302 to provide a modified RF signal 308 at the output of the match 104. The modified RF signal 308 is provided to the lower electrode of the substrate support SS via the RF transmission line 124.

Similarly, upon receiving the RF signal 304 at the input of the match 110, the match 110 matches an impedance of the load coupled to the output of the match 110 with an impedance of the source coupled to the input of the match 110. The impedances are matched to modify an impedance of the RF signal 304 to provide a modified RF signal 310 at the output of the match 110. The modified RF signal 310 is provided to the upper electrode UE via the RF transmission line 128.

Also, upon receiving the RF signal 306 at the input of the match 120, the match 120 matches an impedance of the load coupled to an output of the match 120 with an impedance of the source coupled to the input of the match 120. The impedances are matched to modify an impedance of the RF signal 306 to provide a modified RF signal 312 at the output of the match 120. The modified RF signal 312 is provided to the edge ring ER via the RF transmission line 132.

When the one or more process gases are supplied to the gap between the substrate support SS and the upper electrode UE within the plasma chamber 106 in addition to the modified RF signals 308, 310 and 312, plasma is stricken or maintained within the plasma chamber 106. The plasma generated within the plasma chamber 106 is used to process the substrate SU. For example, the plasma is used to deposit materials on a top surface of the substrate SU or etch the substrate SU or clean the substrate SU. When the phase difference between the phases of the RF signals 306 and 304 is ϕ, a rate, such as an etch rate or a deposition rate or a cleaning rate, of processing of the substrate SU increases compared to when the phase difference is not ϕ. The rate is increased when a flux of the secondary electrons flowing from the upper electrode UE to the lower electrode is maximum. The increase in the flux reduces chances of transition wiggling, which is described below, thereby increasing the rate of processing.

In an embodiment, the recipe signal 303 does not include the phase of the RF signal 302 and the recipe signal 305 does not include the phase of the RF signal 304. Rather, the processor 114 sends a master trigger signal to the master RF generator system 102 and a slave trigger signal to the slave RF generator system 108 to achieve the phase difference ϕ. For example, the processor 114 sends the master trigger signal to the master RF generator system 102 after a time period equal to the phase difference ϕ after sending the slave trigger signal to the slave RF generator system 108. To illustrate, the processor 114 sends the slave trigger signal to the slave RF generator system 108 at a first time. In the illustration, after sending the slave trigger signal, the processor 114 waits for the time period equal to the phase difference ϕ and sends the master trigger signal to the master RF generator system 102 at a second time. Further, in the illustration, upon receiving the master trigger signal, the master RF generator system 102 generates the RF signal 302. Also, in the illustration, upon receiving the slave trigger signal, the slave RF generator system 108 generates the RF signal 304.

In an embodiment, in a power control mode, power levels of the RF signals 302, 304, and 306 are controlled. In the power control mode, the power level of the RF signal 302, the power level of the RF signal 304, and the power level of the RF signal 306 are controlled by the processor 114. Based on the phase difference ϕ and the power levels of the RF signals 302, 304, and 306, an etch profile and an etch rate of etch features of the substrate SU are controlled.

In one embodiment, instead of a power level, a voltage level of an RF signal is controlled in a voltage control mode. In the voltage control mode, a voltage level of the RF signal 302, a voltage level of the RF signal 304, and a voltage level of the RF signal 306 are controlled by the processor 114. Based on the phase difference ϕ and the voltage levels of the RF signals 302, 304, and 306, an etch profile and an etch rate of etch features of the substrate SU are controlled.

FIG. 4 is a diagram of an embodiment of a graph 400 to illustrate a clock signal 402. The graph 400 plots a logic level of the clock signal 402 versus the time t. As illustrated, the clock signal 402 pulses from a logic level 0 to a logic level 1 at the time t0 and remains at the logic level 1 from the time t0 to the time t3. The clock signal 402 pulses from the logic level 1 to the logic level 0 at the time t3 and remains at the logic level 0 from the time t3 to the time t6. The cycle 1 of the clock signal 402 starts at the time t0 and ends at the time t6. The cycle 2 of the clock signal 402 starts at the time t6 and ends at the time t12.

FIG. 5 is a diagram of an embodiment of a graph 500 to illustrate an RF signal 502 that is pulsed. The graph 500 plots a parameter of the RF signal 502 versus the time t. The RF signal 502 is an example of the RF signal 136 or 304 (FIGS. 1 and 3) generated by the slave RF generator system 108 (FIG. 1). The RF signal 502 has an envelope 504, which is pulsed at a duty cycle. An example of the envelope 504 is a peak-to-peak amplitude or a zero-to-peak amplitude. The envelope 504 transitions from a parameter level P0 to parameter levels P1 and −P1 at the time t0 and remains at the parameter levels P1 and −P1 from the time t0 to a time t18. The parameter level P1 is greater than the parameter level P0. An example of a parameter is voltage or power.

The envelope 504 transitions at the time t18 from the parameter levels P1 and −P1 to the parameter level P0, and remains at the parameter level P0 from the time t18 to a time t36. The parameter levels P1 and −P1 and P0 repeat again from the time t36 to a time t72. The envelope 504 forms a pulse between the times t0 and t36 and another pulse between the times t36 and t72. As such, the envelope 504 has a duty cycle of 50% and represents a digital signal or a digital pulsed signal.

A duty cycle of an envelope provides a pulsing frequency of the envelope. For example, a pulsing frequency of the envelope is a number of pulses of the envelope per second. The pulsing frequency of the envelope is less than a frequency of an RF signal having the envelope.

In one embodiment, instead of being pulsed, a continuous wave (CW) RF signal is generated by the slave RF generator system 108 (FIG. 1).

In one embodiment, the envelope 504 has a duty cycle different from 50%, such as 25% or 60%.

In one embodiment, the phase difference ϕ is applied during a following cycle of the clock signal 402 (FIG. 4). For example, during the cycle 2 or a cycle 3 or a cycle 4 of the clock signal 402, the processor 114 controls the phase of the RF signal 134 or the phase of the RF signal 136 (FIG. 1) or a combination thereof to achieve the phase difference § between the phases. In the example, any of the cycles 2, 3, or 4 follows the cycle 1 of the clock signal 402. Also, in the example, the cycle 2 is consecutive to the cycle 1, the cycle 3 is consecutive to the cycle 2, and the cycle 4 is consecutive to the cycle 3. The phases of the RF signals 134 and 136 are controlled in the same manner in which the phases of the RF signals 302 and 304 are controlled.

FIG. 6 is a diagram of an embodiment of a graph 600 to illustrate an RF signal 602 that is pulsed. The graph 600 plots a parameter of the RF signal 602 versus the time t. The RF signal 602 is an example of the RF signal 134 or 302 (FIGS. 1 and 3) generated by the master RF generator system 102. The RF signal 602 has an envelope 604, which is pulsed at a duty cycle. An example of the envelope 604 is a peak-to-peak amplitude or a zero-to-peak amplitude. The envelope 604 transitions from a parameter level P0 to parameter levels Pa and −Pa at the time t0 and remains at the parameter levels Pa and −Pa from the time t0 to a time t18. The parameter level Pa is greater than the parameter level P0.

The envelope 604 transitions at the time t18 from the parameter levels Pa and −Pa to the parameter level P0, and remains at the parameter level P0 from the time t18 to the time t36. The parameter levels Pa and −Pa and P0 repeat again from the time t36 to the time t72. The envelope 604 forms a pulse between the times t0 and t36 and another pulse between the times t36 and t72. As such, the envelope 604 has a duty cycle of 50% and represents a digital signal or a digital pulsed signal.

In one embodiment, the envelope 604 has a duty cycle different from 50%, such as 30% or 70%.

In an embodiment, the RF signal 138 or 306 (FIGS. 1 and 3) that is generated by the slave RF generator system 118 is similar to the RF signal 602. For example, the RF signal 138 or 306 has the same frequency as that of the RF signal 602 but has a different parameter level, such as a higher or a lower parameter level, than that of the RF signal 602. As another example, the RF signal 138 or 306 has the same frequency as that of the RF signal 602 and has the same parameter level as that of the RF signal 602.

Figures 7A, 7B:
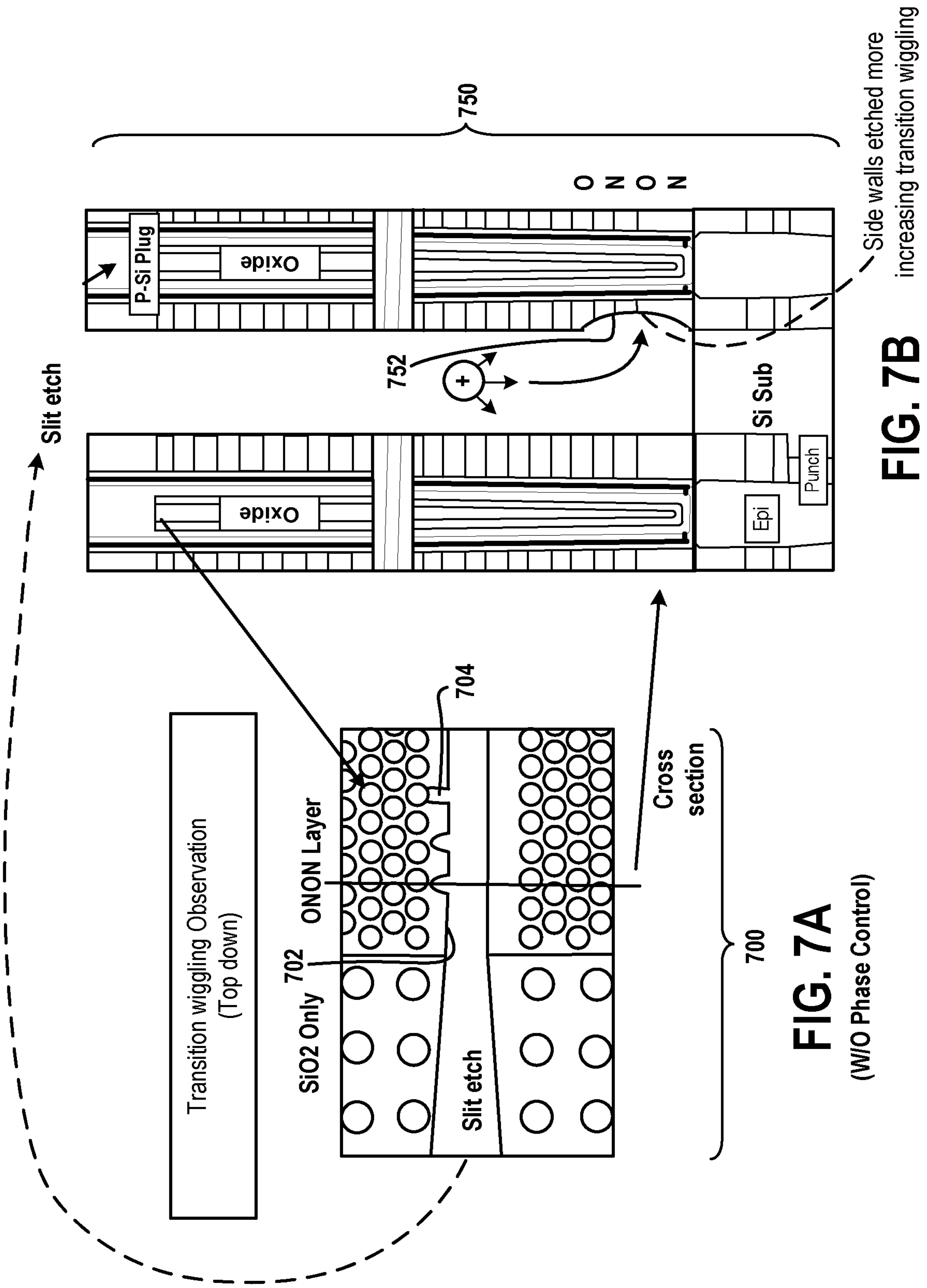
FIG. 7A is a top down view of an embodiment of a stack to illustrate that a side wall of a feature, such as a channel, of the stack is etched when the phase difference is not applied while processing the stack.
FIG. 7B is a side view of an embodiment of the stack of FIG. 7A.

FIG. 7A is a top down view of an embodiment of a stack 700 to illustrate that a side wall 702 of the stack 700 is etched when the phase difference is not ϕ. The stack 700 includes another stack of oxide (O) and nitride (N) layers, and includes a silicon dioxide ($SiO_2$) layer. As shown, there is a cavity 704 formed in the side wall 702 represents transition wiggling that is created by the nonuse of the phase difference ϕ. As an example, transition wiggling represents a depth of the cavity 704 from a flat surface of the side wall 702.

FIG. 7B is a side view of an embodiment of a stack 750, which is an example of the stack 700 (FIG. 7A). The stack 750 has a silicon substrate on which an ONON layer is overlaid, and on top of the ONON layer, the silicon dioxide layer is overlaid. A cavity 752 is illustrated in FIG. 7B. The cavity 752 represents transition wiggling.

Figure 8:
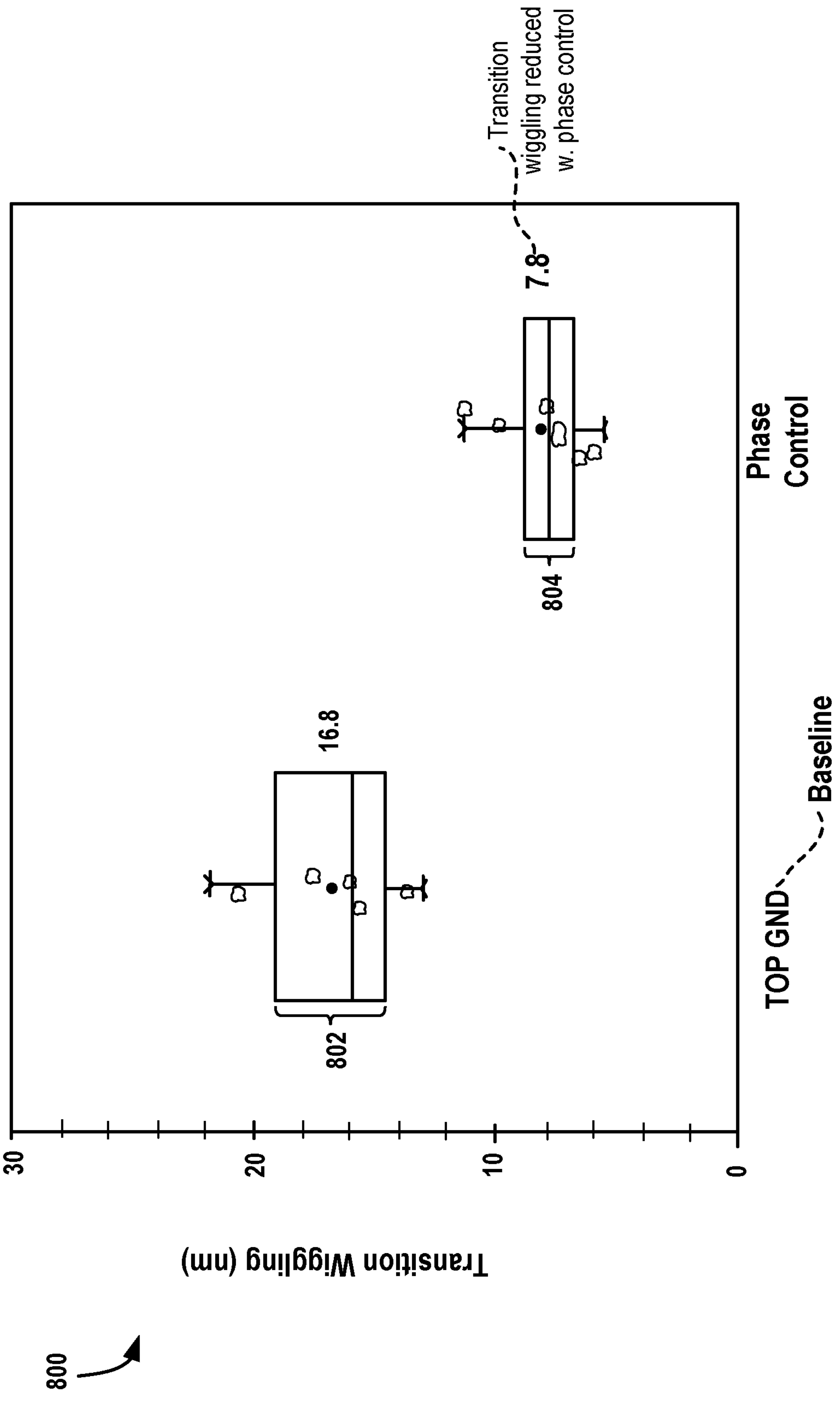
FIG. 8 is an embodiment of a graph to illustrate that transition wiggling is reduced when the phase difference is applied.

FIG. 8 is an embodiment of a graph 800 to illustrate that transition wiggling is reduced when the phase difference ϕ is applied. The graph 800 plots transition wiggling in nanometers (nm) versus a configuration of the upper electrode UE. When the phase difference ϕ is not applied, an amount 802 of transition wiggling is greater. For example, when the upper electrode UE is coupled to a ground (GND) potential, the amount 802 of transition wiggling occurs. The amount 802 is greater than another amount 804 of transition wiggling when the phase difference ϕ is applied to the upper electrode UE.

Embodiments, described herein, may be practiced with various computer system configurations including hand-held hardware units, microprocessor systems, microprocessor-based or programmable consumer electronics, minicomputers, mainframe computers and the like. The embodiments, described herein, can also be practiced in distributed computing environments where tasks are performed by remote processing hardware units that are linked through a computer network.

In some embodiments, a controller is part of a system, which may be part of the above-described examples. The system includes semiconductor processing equipment, including a processing tool or tools, chamber or chambers, a platform or platforms for processing, and/or specific processing components (a wafer pedestal, a gas flow system, etc.). The system is integrated with electronics for controlling its operation before, during, and after processing of a semiconductor wafer or substrate. The electronics is referred to as the "controller," which may control various components or subparts of the system. The controller, depending on processing requirements and/or a type of the system, is programmed to control any process disclosed herein, including a delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with the system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, DSPs, chips defined as ASICs, PLDs, one or more microprocessors, or microcontrollers that execute program instructions (e.g., software). The program instructions are instructions communicated to the controller in the form of various individual settings (or program files), defining operational parameters for carrying out a process on or for a semiconductor wafer. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access for wafer processing. The controller enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to the system over a computer network, which includes a local network or the Internet. The remote computer includes a user interface that enables entry or programming of parameters and/or settings, which are then communicated to the system from the remote computer. In some examples, the controller receives instructions in the form of settings for processing a wafer. It should be understood that the settings are specific to a type of process to be performed on a wafer and a type of tool that the controller interfaces with or controls. Thus as described above, the controller is distributed, such as by including one or more discrete controllers that are networked together and working towards a common purpose, such as the fulfilling processes described herein. An example of a distributed controller for such purposes includes one or more integrated circuits on a chamber in communication with one or more integrated circuits located remotely (such as at a platform level or as part of a remote computer) that combine to control a process in a chamber.

Without limitation, in various embodiments, a plasma system, described herein, includes a plasma etch chamber, a deposition chamber, a spin-rinse chamber, a metal plating chamber, a clean chamber, a bevel edge etch chamber, a physical vapor deposition (PVD) chamber, a chemical vapor deposition (CVD) chamber, an atomic layer deposition (ALD) chamber, an atomic layer etch (ALE) chamber, an ion implantation chamber, a track chamber, or any other semiconductor processing chamber that is associated or used in fabrication and/or manufacturing of semiconductor wafers.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an inductively coupled plasma (ICP) reactor, a transformer coupled plasma (TCP) reactor, conductor tools, dielectric tools, a plasma chamber including an electron cyclotron resonance (ECR) reactor, etc. For example, an X MHZ RF generator, a Y MHz RF generator, and a Z MHz RF generator are coupled to an inductor within the ICP plasma chamber.

As noted above, depending on a process operation to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These computer-implemented operations are those that manipulate physical quantities.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations, described herein, are performed by a computer selectively activated, or are configured by one or more computer programs stored in a computer memory, or are obtained over a computer network. When data is obtained over the computer network, the data may be processed by other computers on the computer network, e.g., a cloud of computing resources.

One or more embodiments, described herein, can also be fabricated as computer-readable code on a non-transitory computer-readable medium. The non-transitory computer-readable medium is any data storage hardware unit, e.g., a memory device, etc., that stores data, which is thereafter read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although some method operations, described above, were presented in a specific order, it should be understood that in various embodiments, other housekeeping operations are performed in between the method operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A method for increasing a rate of processing a substrate, comprising:

receiving a parameter signal from a first sensor when a first radio frequency (RF) signal is provided to a substrate support and a second RF signal is provided to an upper electrode;

determining, based on the parameter signal, a first time at which a value of a parameter is maximum, wherein the first time occurs during a cycle of a clock signal;

receiving a variable signal from a second sensor;

determining, based on the variable signal, a second time at which a first amount of flux of secondary electrons from the upper electrode to the substrate support is maximum, wherein the second time occurs during the cycle and occurs after the first time;

determining a phase difference to be a difference between the first time and the second time; and causing the phase difference between a phase of a third RF signal and a phase of a fourth RF signal, wherein the third RF signal is provided to the upper electrode and the fourth RF signal is provided to the substrate support, wherein said causing the phase difference is performed to increase the rate of processing of the substrate.

2. The method of claim 1, wherein said causing the phase difference comprises:

supplying a first trigger signal to a bias RF generator at a fourth time to generate the fourth RF signal; and supplying a second trigger signal to a source RF generator to generate the third RF signal at a fifth time, wherein a difference between the fourth time and the fifth time is equal to the phase difference.

3. The method of claim 1, wherein the parameter is a voltage, wherein the first sensor is a voltage sensor that is coupled between an impedance match and the substrate support, and wherein the second sensor is a magnetic field sensor.

4. The method of claim 1, further comprising determining a third time at which a second amount of flux of secondary electrons is maximum, wherein third time occurs during the cycle and occurs between the first and second times.

5. The method of claim 1, wherein said causing the phase difference is performed during processing of the substrate, wherein said receiving the parameter signal, determining the first time, receiving the variable signal, determining the second time, and determining the phase difference are performed during a lab routine.

6. The method of claim 1, wherein said causing the phase difference is performed during a following cycle of the clock signal.

7. The method of claim 1, wherein said determining the first time is based on the clock signal and said determining the second time is based on the clock signal, wherein the second RF signal has a frequency that is generated based on a frequency of the first RF signal, wherein the third RF signal has a frequency that is generated based on a frequency of the fourth RF signal.

8. The method of claim 1, wherein the variable signal is generated based on a magnetic flux.

9. A method for increasing a rate of processing a substrate to cause an etch profile of the substrate, comprising:

determining a first time at which a first amount of flux of secondary electrons from a substrate support to an upper electrode is maximum, wherein the first time occurs within a first clock cycle during which the substrate support receives a first radio frequency (RF) signal and the upper electrode receives a second RF signal;

determining a second time at which a second amount of flux of secondary electrons from the upper electrode to the substrate support is maximum, wherein the second time occurs within the first clock cycle;

determining a phase difference to be a difference between the second time and the first time; and causing the phase difference between a phase of a third RF signal and a phase of a fourth RF signal, wherein the third RF signal is provided to the upper electrode and the fourth RF signal is provided to the substrate support, wherein said causing the phase difference is performed to increase the rate of processing of the substrate.

10. The method of claim 9, wherein said causing the phase difference comprises:

supplying a first trigger signal to a bias RF generator at a fourth time to generate the fourth RF signal; and supplying a second trigger signal to a source RF generator to generate the third RF signal at a fifth time, wherein a difference between the fourth time and the fifth time is equal to the phase difference.

11. The method of claim 9, further comprising receiving a measurement signal representing the first and second amounts of flux from a magnetic field sensor.

12. The method of claim 9, wherein the second time occurs after the first time.

13. The method of claim 9, wherein said causing the phase difference is performed during processing of the substrate, wherein said determining the first time, determining the second time, and determining the phase difference are performed during a lab routine.

14. The method of claim 9, wherein said causing the phase difference is performed during a second clock cycle of a clock signal, wherein the second clock cycle follows the first clock cycle.

15. A controller comprising:

a processor configured to:

receive a parameter signal from a first sensor when a first radio frequency (RF) signal is provided to a substrate support and a second RF signal is provided to an upper electrode;

determine, based on the parameter signal, a first time at which a value of a parameter is maximum, wherein the first time occurs during a cycle of a clock signal;

receive a variable signal from a second sensor;

determine, based on the variable signal, a second time at which a first amount of flux of secondary electrons from the upper electrode to the substrate support is maximum, wherein the second time occurs during the cycle and occurs after the first time;

determine a phase difference to be a difference between the first time and the second time; and cause the phase difference between a phase of a third RF signal and a phase of a fourth RF signal, wherein the third RF signal is provided to the upper electrode and the fourth RF signal is provided to the substrate support, wherein the phase difference is caused to increase the rate of processing of the substrate; and a memory device coupled to the processor.

16. The controller of claim 15, wherein to cause the phase difference, the processor is configured to:

supply a first trigger signal to a bias RF generator at a fourth time to generate the fourth RF signal; and supply a second trigger signal to a source RF generator to generate the third RF signal at a fifth time, wherein a difference between the fourth time and the fifth time is equal to the phase difference.

17. The controller of claim 15, wherein the parameter is a voltage, wherein the first sensor is a voltage sensor that is coupled between an impedance match and the substrate support, and wherein the second sensor is a magnetic field sensor.

18. The controller of claim 15, wherein the processor is configured to determine a third time at which a second amount of flux of secondary electrons is maximum, wherein third time occurs during the cycle and occurs between the first and second times.

19. The controller of claim 15, wherein the phase difference is caused during processing of the substrate, wherein the parameter signal is received, the first time is determined, the variable signal is received, the second time is determined, and the phase difference is determined during a lab routine.

20. The controller of claim 15, wherein the phase difference is caused during a following cycle of the clock signal.

* * * * *